US012651690B2

(12) United States Patent
Cahalen et al.

(10) Patent No.: US 12,651,690 B2
(45) Date of Patent: Jun. 9, 2026

(54) IRON ALLOY COATINGS FOR WIRELESS RECHARGING DEVICES AND RELATED METHODS

(71) Applicant: Xtalic Corporation, Marlborough, MA (US)

(72) Inventors: John Cahalen, Arlington, MA (US); Stephen G. Lucas, Pacific City, OR (US); Robert D. Hilty, Walpole, MA (US); Lisa J. Chan, Boston, MA (US)

(73) Assignee: Xtalic Corporation, Marlborough, MA (US)

( * ) Notice: Subject to any disclaimer, the term of this patent is extended or adjusted under 35 U.S.C. 154(b) by 744 days.

(21) Appl. No.: 18/169,815

(22) Filed: Feb. 15, 2023

(65) Prior Publication Data

US 2024/0274343 A1     Aug. 15, 2024

(51) Int. Cl.
| | |
|---|---|
| *B32B 3/08* | (2006.01) |
| *B32B 3/10* | (2006.01) |
| *H01F 1/147* | (2006.01) |
| *H01F 27/28* | (2006.01) |
| *H01F 41/04* | (2006.01) |
| *H05K 1/16* | (2006.01) |
| *H02J 50/10* | (2016.01) |

(52) U.S. Cl.
CPC ........... *H01F 27/2804* (2013.01); *B32B 3/08* (2013.01); *B32B 3/085* (2013.01); *B32B 3/10* (2013.01); *H01F 1/14708* (2013.01); *H01F 41/041* (2013.01); *H05K 1/165* (2013.01); *H02J 50/10* (2016.02)

(58) Field of Classification Search
CPC .. B32B 3/08; B32B 3/085; B32B 3/10; B32B 3/14; B32B 3/22; B32B 3/30; H05K 1/165; H05K 1/0393; H01F 5/003; H01F 41/041; H01F 27/2804
See application file for complete search history.

(56) References Cited

U.S. PATENT DOCUMENTS

| | | | |
|---|---|---|---|
| 3,370,929 A | 2/1968 | Mathias | |
| 4,208,254 A | 6/1980 | Mitsumoto et al. | |
| 6,075,432 A * | 6/2000 | Reymond | H01F 17/0006 |
| | | | 428/209 |
| 10,601,468 B2 | 3/2020 | Kowalski et al. | |
| 2009/0085706 A1 | 4/2009 | Baarman et al. | |
| 2011/0128111 A1 | 6/2011 | Roozeboom et al. | |
| 2014/0141037 A1 | 5/2014 | Swanson et al. | |
| 2018/0069599 A1 | 3/2018 | Kowalski et al. | |
| 2018/0069600 A1 | 3/2018 | Kowalski et al. | |
| 2018/0086211 A1 | 3/2018 | Samuelsson et al. | |
| 2018/0343042 A1 | 11/2018 | Luzinski et al. | |

(Continued)

OTHER PUBLICATIONS

[No Author Listed], Vitroperm 220-250. Vacuumschmelze. https://vacuumschmelze.com/03_Documents/Brochures/VITROPERM%20220%20-%20250.pdf [last accessed Nov. 21, 2022]: 2 pages.

(Continued)

*Primary Examiner* — Elizabeth E Mulvaney

(74) *Attorney, Agent, or Firm* — Wolf, Greenfield & Sacks, P.C.

(57)     ABSTRACT

Coatings comprising iron alloys that include iron and at least another metal (e.g., cobalt and/or nickel) for wireless recharging devices are generally described. The coatings may be directly applied to a substrate, such as a print circuit board.

18 Claims, 3 Drawing Sheets

(56) References Cited

U.S. PATENT DOCUMENTS

| | | | |
|---|---|---|---|
| 2019/0100847 A1 | 4/2019 | Shen et al. | |
| 2020/0076232 A1 | 3/2020 | Woo et al. | |
| 2020/0083736 A1 | 3/2020 | Graham et al. | |
| 2020/0381931 A1 | 12/2020 | Hilty et al. | |
| 2021/0388518 A1 | 12/2021 | Cahalen et al. | |
| 2023/0116340 A1* | 4/2023 | Song ..................... H01F 27/366 |
| | | | 29/847 |

OTHER PUBLICATIONS

Rasmussen et al., Electroplating and characterization of cobalt-nickel-iron and nickel-iron for magnetic microsystems applications. Sens Actuator A Phys. Aug. 2001;92(1-3):242-8.

International Search Report and Written Opinion for International Application No. PCT/US2024/15983 dated Feb. 15, 2024.

International Preliminary Report on Patentability for International Application No. PCT/US2024/15983 dated Aug. 28, 2025.

\* cited by examiner

IRON ALLOY COATINGS FOR WIRELESS RECHARGING DEVICES AND RELATED METHODS

TECHNICAL FIELD

Iron alloys comprising iron and another metal (e.g., cobalt and/or nickel) for wireless recharging devices are generally described.

BACKGROUND

Wireless charging coils, like those found on mobile phones, can provide quick and easy charging. However, these charging systems can have poor efficiency and slow charging. Inductive coupling between the transmit and receive coils may be improved by modifying the conductor used to fabricate these coils.

SUMMARY

Iron alloys comprising iron and another metal (e.g., cobalt and/or nickel) for wireless recharging devices are generally described.

In one aspect, an article is described, the article comprising a coil and a metallic coating comprising an iron alloy deposited on the coil, wherein at least a portion of a surface of the coil is free of the metallic coating.

In another aspect, a circuit board is described comprising a plurality of traces on the circuit board, and a metallic coating comprising an iron alloy deposited on a first trace of the plurality of traces; wherein a portion of the first trace is free of the metallic coating.

In another aspect, a method of fabricating a coil on a circuit board, the method comprising forming a first trace on the circuit board and coating the first trace with a metallic coating comprising an iron alloy, wherein at least a portion of the first trace is free of the metallic coating.

Other advantages and novel features of the present disclosure will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Articles and systems (e.g., devices) that include iron alloy coatings and related methods are generally described below. The iron alloys may be deposited as coatings onto a metal or a surface (e.g., a surface adjacent to a metal) and may include other metals within the iron alloy, such as cobalt and/or nickel. In some cases, the coating can be applied to a circuit board (e.g., a print circuit board, PCB) as a part of a wireless recharging device. Advantageously, the coating can be applied directly to the circuit board. For cases in which the coating has a particular shape (e.g., a coil), this may eliminate the need to fabricate the particular shape separately and then, subsequently, applying the fabricated shape to the circuit board. By using the articles, systems, and method described herein, the shape can be applied directly to the circuit board (e.g., to one or more traces of the circuit board), reducing fabrication time and/or expenses (e.g., less material required by forming the shape directly on the circuit board). Other applications of the iron alloys are described in more detail below.

Turning to the figures, specific non-limiting embodiments are described in further detail. It should be understood that the various systems, components, features, and methods described relative to these embodiments may be used either individually and/or in any desired combination as the disclosure is not limited to only the specific embodiments described herein.

Figure 1A:
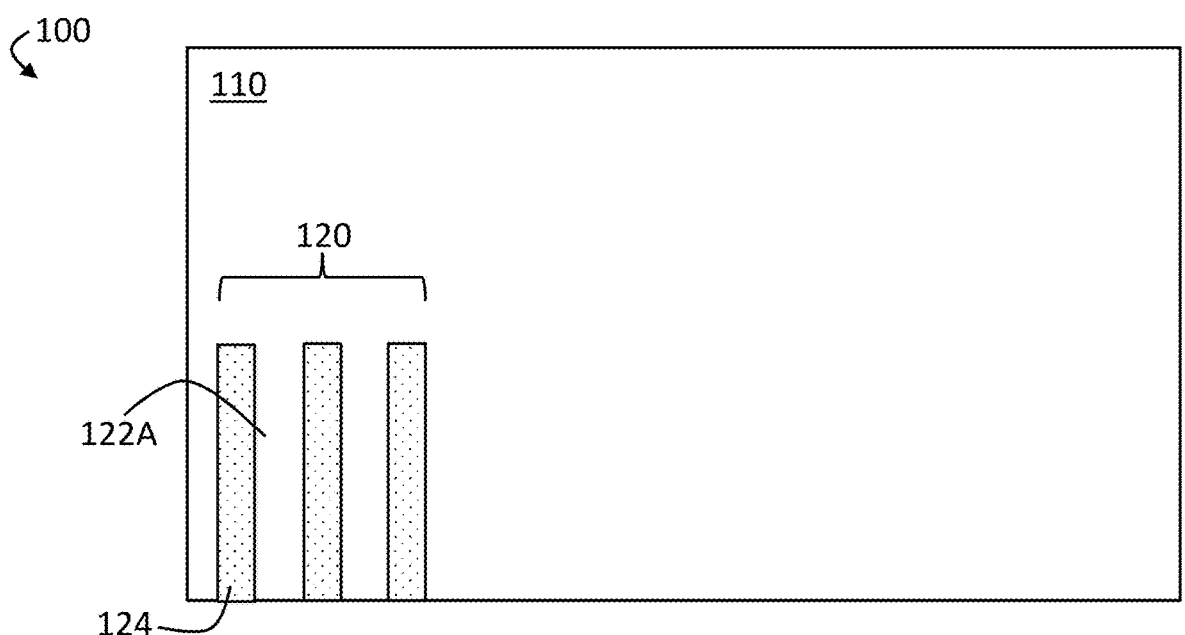
FIG. 1A schematically depicts a device comprising a circuit board, the circuit board comprising a plurality of traces formed on the circuit board, wherein the plurality of traces includes a first trace, according to some embodiments.

By way of illustration, FIG. 1A schematically depicts a device 100 that includes a circuit board 110. A plurality of traces 120 can be formed on or in the circuit board 110, for example, by printing, etching, or other techniques. Details regarding techniques for forming traces in the circuit board are described elsewhere herein. In some embodiments, the circuit comprises a metal (e.g., copper) or another type of conductive material, and forming the first traces reveals the metal or conductive material of the circuit board (e.g., etching a layer of the circuit board to reveal copper or some other underlying material). By way of illustration and not limitation, FIG. 1A shows underlying material 124, revealed by forming trace 120A.

Figure 1B:
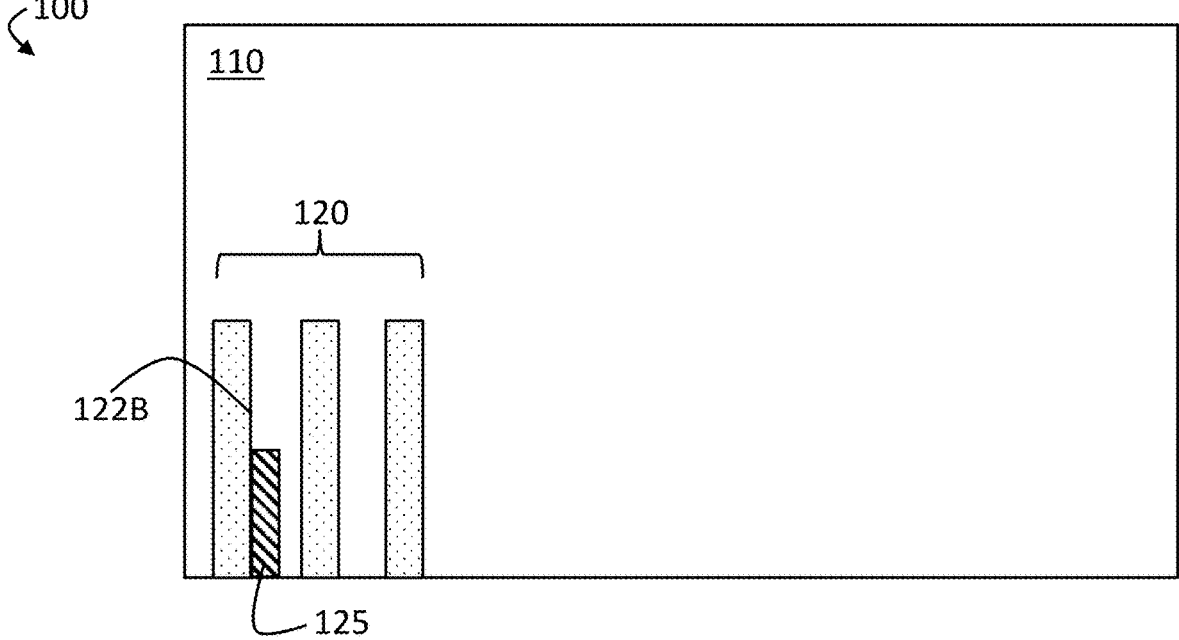
FIG. 1B is a schematic diagram showing the first trace of the plurality of traces on the circuit board has been at least partially coated, according to some embodiments.
Figure 1C:
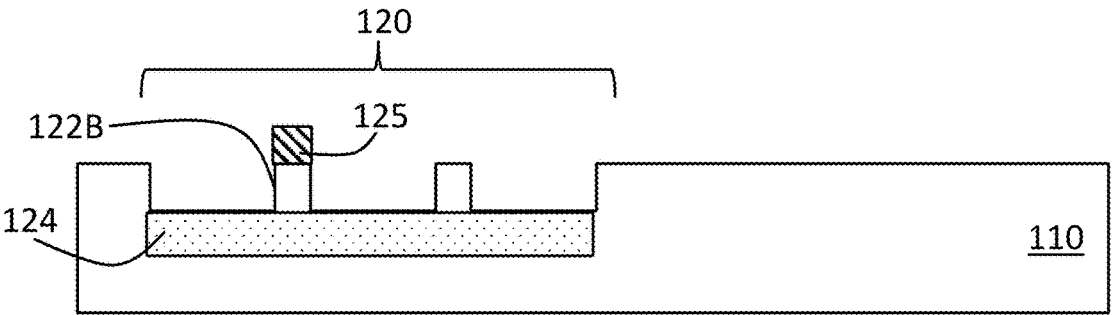
FIG. 1C is a side perspective of the circuit board schematically illustrating a trace that has been partially coated by the coating, according to some embodiments.

In some embodiments, a coating is applied to or proximate to one or more traces. For example, in FIG. 1B, a first trace 120A has been partially coated with partial coating 125. The coating need not be applied to the entirety of the trace, and, in some embodiments, the coating is applied to only a portion of a trace (e.g., one surface of the trace, two surfaces of the trace). By way of illustration (and not limitation), FIG. 1C shows another perspective of the circuit board 110 relative to FIG. 1A and FIG. 1B. In FIC. 1C, this side perspective depicts the plurality of traces 120 etched into the circuit board 110. As shown in the figure, the coating in the first trace 122B is applied only a portion of this trace relative to the first trace shown by 122A in FIG. 1A and leaves at least a portion of the first trace 122A uncoated. Advantageously, by coating only a portion of one or more traces, the amount of materials required to coat the trace is reduced, for example, relative to coating an entire wire and placing it on the circuit board. That is to say, one advantage of forming coatings directly on the circuit board is to reduce the amount of material required to form a coating and/or a coated object (e.g. a coil). However, in other embodiments, the entirety of the trace (and/or each of the plurality of traces) is coated.

Figure 1D:
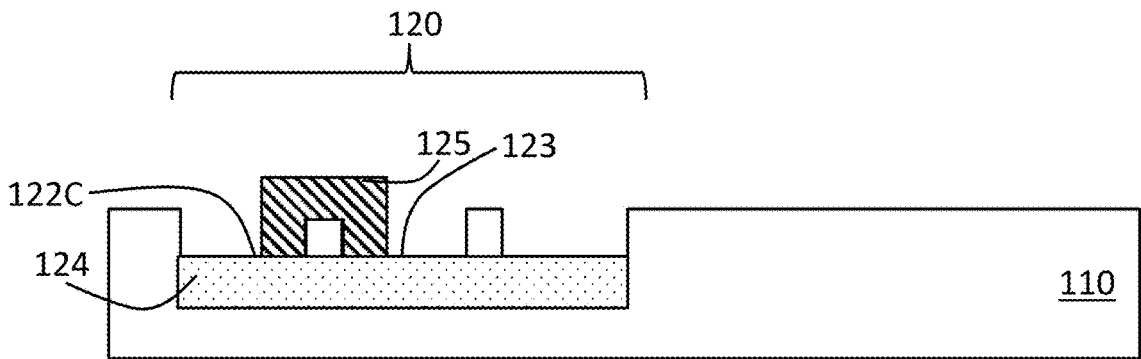
FIG. 1D is side perspective of a circuit board in which the coating extends from the first trace towards the second trace to contact the underlying material, according to some embodiments.

In some embodiments, at least a portion of a trace on the circuit board (e.g., a first trace) is coated such that the thickness of the coating extends beyond a surface of the circuit board. For example, in FIG. 1D, the coating 125 applied to first trace 122C extends beyond a top surface of the circuit board 110. In this manner, objects may be formed in and/or on the circuit board that are not flush with the circuit board. In some embodiments, the coating may join or connect two traces (e.g., an underlying material proximate to a first trace and a second trace). For example, in FIG. 1D, coating 125 is applied to the first trace 122 and a second trace 123, such that the underlying material 125 makes contact with the coating on one side of the first trace 122 and the second trace 123.

Figure 1E:
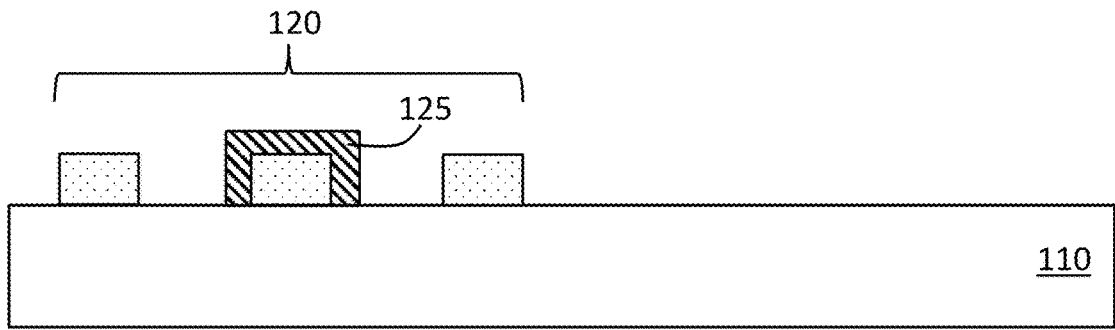
FIG. 1E shows a schematic side perspective of a circuit board where the plurality of traces has been applied on top of the circuit board, and a coating has been applied to at least one trace, according to some embodiments.

In some embodiments, a trace or a plurality of traces are applied onto a substrate (e.g., a flexible substrate). In some such embodiments, a coating can be (directly) applied to a trace (e.g., a first trace of the plurality of traces). By way of illustration (and not limitation), FIG. 1E schematically depicts an embodiment in which the plurality of traces 120 are on top of the circuit board 110. As shown in the figure, the coating 125 can be directly deposited onto a trace of the plurality of traces 120.

Figure 1F:
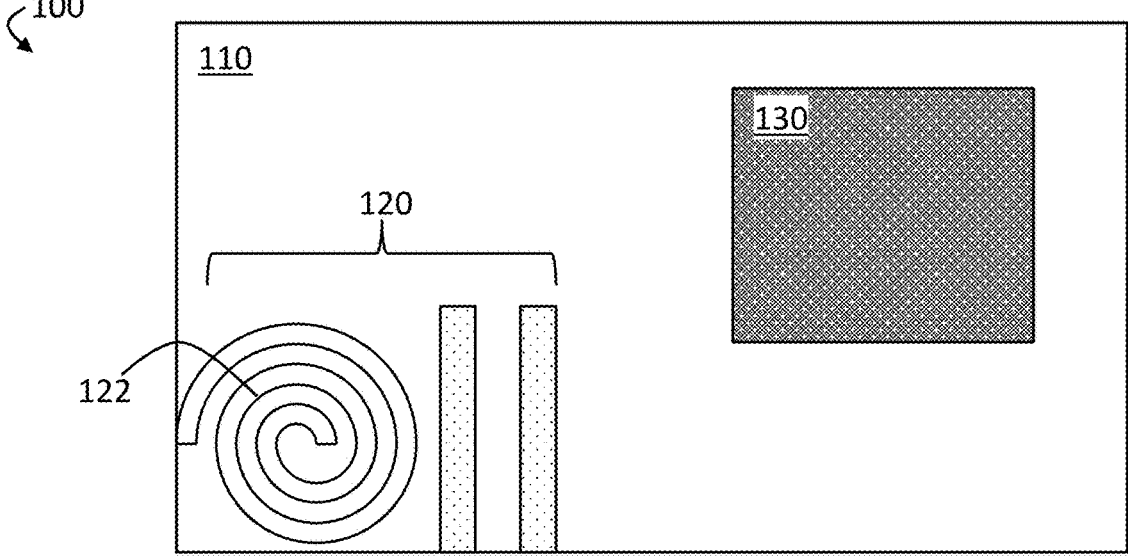
FIG. 1F schematically depicts a device comprising a circuit board with additional components, wherein the circuit board includes a trace in the shape of a coil and wherein at least a portion of the coil-shaped trace may be partially coated with an iron alloy, according to some embodiments.

The first trace (and/or a coating formed on or proximate to the first trace) may be of any desired shape. For example, in some embodiments, the first trace (and/or an object formed on or in the first trace) is in the shape of a coil. As can be seen in FIG. 1F, the first trace 122D is in the form of a coil. This trace can be (at least partially) coated to form a coating in the shape of the coil (e.g., a coiled wire comprising the coating), as shown in the figure. By way of comparison, if wire were first coated, coiled, and then placed on the circuit board, at least some of the coating would be covered when applying the wire to the circuit board. By using the articles and methods described herein, at least a portion of the trace may have a surface uncoated by the coating, improving the ease of fabrication of a coil (or some other shape deposited on the trace). In some embodiments, the uncoated surface of the trace is unexposed portion of the trace (e.g., not directly on the surface of the substrate or circuit board, but adjacent to layer of the surface of the substrate).

It should be understood that when a portion (e.g., layer, structure, a coating) is "on", "adjacent", "proximate", "above", "over", "overlying", or "supported by" another portion, it can be directly on the portion, or an intervening portion (e.g., layer, structure, region, coating) may also be present. Similarly, when a portion is "below" or "underneath" another portion, it can be directly below the portion, or an intervening portion (e.g., layer, structure, region) may also be present. A portion that is "directly adjacent", "directly on", "immediately adjacent", "in contact with", or "directly supported by" another portion means that no intervening portion is present. It should also be understood that when a portion is referred to as being "on", "above", "adjacent", "over", "overlying", "in contact with", "below", or "supported by" another portion, it may cover the entire portion or a part of the portion.

In some embodiments, the device comprises additional components (e.g., a power source, one or more transistors, electrical circuitry). For example, as shown in FIG. 1F, the device 100 further comprises an additional component 130.

While the figures give reference to a first trace, it should be understood that the features of the first trace may apply to any of the traces of the plurality of traces (e.g., a second trace, a third trace, a fourth trace, a fifth trace). That is, any one of the traces of the plurality of traces may be coated and/or partially coated, as desired for a particular application. And, as with the first trace, at least some of the other traces of the plurality of traces may be partially coated or entirely coated.

As described above, a coating (e.g., a metallic coating) may be applied to a circuit board (e.g., a printed circuit board). However, it should be understood that the coating may be applied to a variety of articles, such as a wire, a substrate (e.g., a silicon substrate, a copper substrate), and more. In many embodiments, the coating comprises an iron alloy. The iron alloy comprises at least 30 wt % iron (Fe) relative to other metals of the alloy (e.g., nickel, cobalt, additional metals). Details regarding the iron alloy are described below and elsewhere herein.

In some embodiments, the coating layer is adjacent to a trace (or is a layer adjacent to copper underneath a trace). In some embodiments, a first layer is deposited onto a first trace. In some embodiments, the coating comprises a plurality of layers (e.g., a first layer, a second layer, a third layer) deposited onto a trace (or onto a layer of copper underneath the trace).

The thickness of the coating (e.g., coating comprising an iron alloy) can be measured in microns (μm) using x-ray fluorescence (XRF). In some embodiments, the coating has a thickness of greater than or equal to 0.1 microns, greater than or equal to 1 micron, greater than or equal to 2 microns, greater than or equal to 5 microns, greater than or equal to 10 microns, greater than or equal to 20 microns, greater than or equal to 30 microns, or greater than or equal to 50 microns. In some embodiments, the coating has a thickness of less than or equal to 50 microns, less than or equal to 30 microns, less than or equal to 20 microns, less than or equal to 10 microns, less than or equal to 2 microns, less than or equal to 1 micron, or less than or equal to 0.1 microns. Combinations of the above-referenced ranges are also possible (e.g., less than or equal to 50 microns and greater than or equal to 0.1 microns). Other ranges are possible. It has been recognized and appreciated by this disclosure that the coating may advantageously have a relatively small thickness (e.g., relative to a circuit board) compared to certain existing coatings (e.g., coated wires, existing coils) and systems.

In some embodiments, the coating comprises an iron alloy. For example, in some embodiments, an amount of iron alloy is greater than or equal to 15 wt %, greater than or equal to 20 wt %, greater than or equal to 25 wt %, greater than or equal to 30 wt %, greater than or equal to 35 wt %, greater than or equal to 40 wt %, or greater than or equal to 50 wt %. In some embodiments, an amount of iron in the iron alloy is less than or equal to 50 wt %, less than or equal to 40 wt %, less than or equal to 35 wt %, less than or equal to 30 wt %, less than or equal to 25 wt %, less than or equal to 20 wt %, or less than or equal to 15 wt %. Combinations of the above-referenced ranges are also possible (e.g., greater than or equal to 20 wt % and less than or equal to 30 wt %). Other ranges are possible. In cases where the entirety of the alloy is not iron, other metals comprise the alloy, such a nickel and/or cobalt, as non-limiting examples of other metals. For example, the iron alloy coating can be an alloy of only iron and nickel with a nickel content of 35-45 weight percent, and hence the remaining weight percent would be 65-55 weight percent iron, respectively. As another example, in some embodiments, the iron alloy is a ternary alloy with a concentration of 15-25 wt % Ni, 35-55 wt % Co and the balance Fe (i.e., 20-50 wt % iron).

In some embodiments, the iron alloy comprises metals other than iron. For example, in some embodiments the metallic iron alloy also comprises nickel (Ni), cobalt (Co), copper (Cu), magnesium (Mg), manganese (Mn), and/or zinc (Zn). Advantageously, the inclusion of nickel to alloy can increase the inductance of the coating (or an object formed from the coating, such as a coil) without significantly increasing the resistance of coating. Other advantages with other metals are contemplated.

For some embodiments, the iron alloy comprises one or more additional metals, such as cobalt and/or nickel. In some embodiments, the amount of the one or more other metals is independently greater than or equal to 20 wt %, greater than or equal to 25 wt %, greater than or equal to 30 wt %, greater than or equal to 35 wt %, greater than or equal to 40 wt %, greater than or equal to 45 wt %, or greater than or equal to 50 wt %. In some embodiments, the amount of the one or more other metals is independently less than or equal to 50 wt %, less than or equal to 45 wt %, less than or equal to 40 wt %, less than or equal to 35 wt %, less than or equal to 30 wt %, or less than or equal to 20 wt %. Combinations of the above-referenced ranges are also possible (e.g., greater than or equal to 30 wt % and less than or equal to 50 wt %). Other ranges are possible. The remainder of wt % of metals in the alloy can be iron or a mixture of iron and additional another metal for a total of 100 wt % that includes nickel, iron, and any other metal present). For example, in some embodiment, the iron alloy is 60 wt % iron, 20 wt % nickel, and 20 wt % cobalt. Of course, other combinations of amounts of metals are possible as this disclosure is not so limited.

In some embodiments, the iron alloy is a binary alloy with two metals. For example, in some embodiments, the iron alloy is an iron-nickel alloy comprising iron and nickel. In some embodiments, the iron alloy is an iron-cobalt alloy comprising iron and cobalt. In some embodiments, the iron alloy is a ternary alloy. For example, in some embodiments, the iron alloy is an iron-nickel-cobalt alloy comprising iron, nickel, and cobalt. In some such embodiments, the nickel and cobalt are present at a 1:1 ratio (by weight). In some embodiments, the iron alloy is a quaternary alloy comprising iron and at least 3 other metals (e.g., nickel, cobalt, and an additional metal, such as zinc). Other combinations of metals with iron are contemplated for the iron alloy as this disclosure is not so limited.

In some embodiments, a ternary iron alloy comprises nickel and cobalt. In some such embodiments, the ratio of nickel to cobalt may be of a particular ratio (e.g., a ratio by weight of nickel to cobalt). In some embodiments, the ratio of nickel to cobalt is greater than or equal to 0.5, greater than or equal to 0.7, greater than or equal to 1, greater than or equal to 1.1, greater than or equal to 1.2, greater than or equal to 1.3, greater than or equal to 1.5, greater than or equal to 1.7, or greater than or equal to 2. In some embodiments, a ratio of nickel to cobalt is less than or equal to 2, less than or equal to 1.7, less than or equal to 1.5, less than or equal to 1.3, less than or equal to 1.2, less than or equal to 1.1, less than or equal to 1, less than or equal to 0.7, or less than or equal to 0.5. Combinations of the above-referenced ranges are also possible (e.g., greater than or equal to 0.8 and less than or equal to 1.2). Other ranges are possible as this disclosure is not so limited.

In some embodiments, the iron alloy comprises a particular crystal structure. For example, in some embodiments, the iron alloy comprises a body-centered cubic (bcc) or face-centered cubic crystal structure (fcc). In some embodiments, a crystal structure of the iron alloy is a hexagonal close packed (hcp) crystal structure. Other crystal structures are possible. In some embodiments, the iron alloy comprises a mixture of two or more crystal phases. For example, in some embodiments, the iron alloy comprises a mixture of face-centered cubic and body-centered cubic crystal structures (i.e., crystal grains comprising a mixture of face-centered cubic and body-centered cubic unit cells). In some embodiments, the iron alloy comprises a mixture of face-centered cubic, body-centered cubic, and/or hexagonal close packed crystal structures.

For some embodiments, the iron alloy may have a nanocrystalline microstructure. As used herein, a "nanocrystalline" structure refers to a structure in which the number-average size of crystalline grains of the alloy is less than one micron. The number-average size of the crystalline grains provides equal statistical weight to each grain and is calculated as the sum of all spherical equivalent grain diameters divided by the total number of grains in a representative volume of the body. Without wishing to be bound by any particular theory, alloys or layers of alloy formed with a nanocrystalline microstructures includes nanoscale grains that provide improved magnetic properties and/or improved wireless charging. However, some embodiments may have a layer formed with an amorphous or partially amorphous structure. As understood by those skilled in the art, an amorphous structure is a non-crystalline structure characterized by having no long-range symmetry in the atomic positions. Examples of amorphous structures include glass, or glass-like structures.

In some embodiments, the iron alloy further comprises a dopant. In some such embodiments, the dopant comprises a rare earth metal. Examples of rare earth metals include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). One advantage of including a rare earth metal in the iron alloy is to improve the magnetic properties of the iron alloy (e.g., the magnetic properties of a metal coated with the iron alloy comprising the dopant). The dopant may be present in any suitable amount. For example, the dopant may be present in the alloy at an amount less than or equal to 5 wt %, less than or equal to 3 wt %, less than or equal to 1 wt %, less than or equal to 0.1 wt %, or less than or equal to 0.01 wt %, or smaller (e.g., less than 1 ppm, less than 1 ppb). In some embodiments, the amount of the dopant is greater than or equal to 0.01 wt %, greater than or equal to 0.1 wt %, greater than or equal to 1 wt %, or greater than or equal to 3 wt %. Combinations of the foregoing range are also contemplated (e.g., greater than or equal to 0.01 wt % and less than or equal to 5 wt %). Of course, other range are possible as this disclosure is not so limited.

In some embodiments, the coating is annealed. For example, in some embodiments, an iron alloy coating is applied (e.g., to a first trace) and the coating is further annealing. Annealing (e.g., an annealing process) can be accomplished by heating the coating and allowing the coating to slowly cool. However, other methods of annealing are possible, such as chemical annealing or plasma annealing, as non-limiting examples. Advantageously, annealing the coating may improve the ductility of the object to which the coating has been applied.

In some embodiments, the iron alloy is applied as a coating on an object. As mentioned above, in some embodiments, the coating is of the shape of a wire or a coil (e.g., a coiled wire). Advantageously, a coil (comprising a coating of the iron alloy as described here) may be used for wireless and/or inductive charging. In some such embodiments, the coating is deposited onto a circuit board (e.g., a print circuit board, PCB). Of course, other shapes (e.g., circular, square, rectangular, etc.) are possible, as this disclosure is not so limiting.

The iron alloy coating may be applied via electrodeposition or electroplating as described in more detail below. However, other approaches may be used to produce these alloys that do not require electroplating. In some embodiments, physical vapor deposition (PVD) can be employed to produce coatings (e.g., on PCB traces). Electroless plating may also be used to produce these alloys. Other approaches are possible as this disclosure is not so limited.

In some embodiments, only a portion (e.g., only 3 surfaces, only 2 surfaces, only 1 surface) of the coil (or some other coated article) is coated with the coating (e.g., a metallic coating, an iron alloy coating). In some embodiments, greater than or equal to 25%, greater than or equal to 50%, or greater than or equal to 75% of the coil is coated by the coating. In some embodiments, less than or equal to 75%, less than or equal to 50%, or less than or equal to 25%. Combinations of the above-referenced ranges are also possible (e.g., greater than or equal to 25% and less than or equal to 75%). Other ranges are possible.

In some embodiments, at least a portion of the coil (or some other coated article) is free of the coating (e.g., a metallic coating). In some embodiments, greater than or equal to 0.1%, greater than or equal to 1%, greater than or equal to 10%, greater than or equal to 25%, greater than or equal to 50%, greater than or equal to 75% of the coil free of the coating. In some embodiments, less than or equal to 75%, less than or equal to 50%, or less than or equal to 25%. Combinations of the above-referenced ranges are also possible (e.g., greater than or equal to 25% and less than or equal to 75%). Other ranges are possible.

As was described earlier in view of the figures, in some embodiments, the iron alloy coating is deposited onto a circuit board (e.g., a print circuit board), for example, onto a trace of the circuit board (e.g., a first trace of a plurality of traces). In some embodiments, one or more traces can be formed into the circuit board by etching. In some embodiments, a trace is formed by printing a trace on a substrate (e.g., a flexible substrate, a polymeric substrate). And while for some embodiments, the coating is applied to a trace, it should be understood that a coating need not be applied to a trace, and, for example, may be applied to a circuit board (or some other object) without a trace. As another example, in one embodiment, a coating (e.g., a first coating) is applied to a circuit board, and then a trace (e.g., a first trace) is applied to the circuit board, and another coating (e.g., a second coating) is applied to this trace such that the coating can be applied on a trace and also on a different portion of the circuit board without the trace. In some embodiments, one or more traces of the plurality of traces is of particular shape (e.g., a coil), and a coating is an applied such that an exposed portion of the trace is coated, while an underlying portion of the trace remains uncoated (e.g., such that at least one surface of the trace is uncoated).

In some embodiments, a circuit board (e.g., a PCB) comprises one or more metals. For example, in some embodiments, the circuit board comprises copper and/or gold. One or more traces (e.g., a first trace, a plurality of traces) may be formed in the circuit board and may expose (at least some) of the metal. For example, a surface (e.g., a top surface) of the circuit board may be etched to expose the one or more metals. In some such embodiments, a coating is applied to at least a portion of the metal. In some such embodiments, the coating may add to or otherwise enhance a property of the metal (e.g., magnetic properties of the metal).

In some embodiments, a circuit comprises a trace comprising a conductive material. For example, a trace may be deposited (e.g., printed) on a substrate, wherein the trace comprises an electrically conductive material, and a coating may be applied on this trace. Conductive materials include metals and conductive polymers. Non-limiting examples of conductive metals include copper (e.g., copper foils), silver (e.g., silver paste), gold, and platinum. Non-limiting examples of conductive polymers include polypyrroles, polyanilines, polyphenylenes, polythiophenes, and polyacetylenes. Other conductive polymers are possible.

For some embodiments, the coating is applied as a film on a flexible substrate (e.g., a flexible PCB). In some such embodiments, the coating may also have a degree of flexibility in order to flex with the flexible substrate.

In some embodiments, a thickness of a coating deposited on a trace (e.g., a trace of a flexible substrate or a PCB) has a particular thickness. In some embodiments, the thickness of a coating is less than or equal to 1 μm, less than or equal to 0.9 μm, less than or equal to 0.8 μm, less than or equal to 0.7 μm, less than or equal to 0.6 μm, less than or equal to 0.5 μm, less than or equal to 0.4 μm, less than or equal to 0.3 μm, less than or equal to 0.2 μm, or less than or equal to 0.1 μm. In some embodiments, the thickness of a coating is greater than or equal to 0.1 μm, greater than or equal to 0.2 μm, greater than or equal to 0.3 μm, greater than or equal to 0.4 μm, greater than or equal to 0.5 μm, greater than or equal to 0.6 μm, greater than or equal to 0.7 μm, greater than or equal to 0.8 μm, greater than or equal to 0.9 μm, or greater than or equal to 1 μm. Combinations of the above-referenced ranges are also possible (e.g., less than or equal to 1 μm and greater than or equal to 0.1 μm). Other ranges are possible. For embodiments in which a coating is applied to more than one trace, each trace may have a thickness within the above-referenced ranges.

In some embodiments, the coating further comprises a dielectric layer and/or an adhesive layer. A dielectric layer is a layer comprising a dielectric material. Dielectric material will be understood to have its ordinary meaning in the art to refer to a material that is an electrical insulator that can be polarized by an applied electric field. Non-limiting examples of dielectric materials include ceramics (e.g., porcelain, silicates), glass, plastics, and oxides of various metals (e.g., iron oxides, aluminum oxides). An adhesive layer can be used to bind layers together or can be advantageous in winding or coiling the wire. For example, in one embodiment, the coating comprises a first iron alloy layer, an adhesive layer, a second iron alloy layer, with the adhesive layer between the first and second iron alloy layer. Other arrangements of iron alloy layers and adhesive and/or dielectric layers is of course possible. Non-limiting examples of adhesive layers include glues, epoxies, and polymer adhesives.

In some embodiments, electrodeposition can be used to form the coating (e.g., an iron alloy coating) or layers onto a surface (e.g., a surface of PCB board, a trace within a surface of a PCB board). Electrodeposition generally involves the deposition (e.g., electroplating) of a material (e.g., electroplate) on a substrate (e.g. metal of a substrate) by contacting the substrate with an electrodeposition bath and flowing electrical current between two electrodes through the electrodeposition bath, i.e., due to a difference in electrical potential between the two electrodes. For example, methods described herein may involve providing an anode, a cathode, an electrodeposition bath (also known as an electrodeposition fluid) associated with (e.g., in contact with) the anode and cathode, and a power supply connected to the anode and cathode. In some cases, the power supply may be driven to generate a waveform for producing a layer, as described more fully below.

Generally, a coating or a layer (e.g., iron alloy coating) may be applied using separate electrodeposition baths. In some cases, individual articles may be connected such that they can be sequentially exposed to separate electrodeposition baths, for example in a reel-to-reel process. For instance, articles may be connected to a common conductive substrate (e.g., a strip). In some embodiments, each of the electrodeposition baths may be associated with separate anodes and the interconnected individual articles may be commonly connected to a cathode.

A variety of electrochemical baths may be used for electrodeposition process. In certain embodiments an electrochemical bath contains at least an iron ionic species. The oxidation state of the iron ionic species may be 2, 3, or any other oxidation state available to iron in its compounds. In some embodiments, other metals may be present. Those metals may be selected from the group consisting of cobalt, copper, magnesium, manganese, nickel, and zinc. Other metals may be suitable. In general, metal salts of Fe, Co, Cu, Mg, Mn, Ni, or Zn may be used as the sources of the metallic species. For example, these salts may be metal chlorides (e.g. $FeCl_3$), metal bromides, metal sulfates, metal nitrates, metal phosphates. Other metal salts or molecular species may be suitable as the disclosure is not so limited. Those of ordinary skill in the art will be able to determine other appropriate metal salt for electrodeposition.

Various embodiments use an electrodeposition bath that may contain at least one component that does not contain a metal species but may further aid in the electrodeposition process. Non-limiting examples of these components include citric acid (and salts thereof), tartaric acid (and salts thereof), acetic acid (and salts thereof), formic acid (and salts thereof), oxalic acid (and salts thereof), boric acid, saccharin, sodium chloride, sodium bromide, ammonium chloride, aluminum sulfate (or a hydrate thereof), alkali phosphates (e.g. $Na_3PO_4$), and non-ionic surfactants. These components may be useful in complexing metal species in solution, adjusting or buffering the pH of the electrodeposition bath, or other useful purposes. In some embodiments, other ligands or complexing agents may be present. In some embodiments, stress-reducing compounds may comprise the electrodeposition bath. In certain embodiments, a buffering agent may further comprise the electrodeposition bath. In certain embodiments, conducting salts may further comprise the electrodeposition bath. Other components may comprise the bath depending on the desired composition of the ferrite layer or the metal oxide layer. In some cases, the electrodeposition bath may further comprise a component that controls the pH, for example, to control the formation of iron hydroxides or $Fe^{3+}$ in the electrodeposition bath or in resulting articles. Broadly, the pH may be maintained between 2-5. In some cases, the pH is kept below 7 to discourage formation of Fe(III). In some embodiments, the pH is kept below 3.5 in order to discourage iron hydroxide formation.

The electrodeposition process or processes may be modulated by varying the potential that is applied between the electrodes (e.g., potential control or voltage control), or by varying the current or current density that is allowed to flow (e.g., current or current density control). In some embodiments, the coating may be formed (e.g., electrodeposited) using direct current (DC) plating, pulsed current plating, reverse pulse current plating, or combinations thereof. In some embodiments, reverse pulse plating may be preferred, for example, to form the layer. Pulses, oscillations, and/or other variations in voltage, potential, current, and/or current density, may also be incorporated during the electrodeposition process, as described more fully below. For example, pulses of controlled voltage may be alternated with pulses of controlled current or current density. In general, during an electrodeposition process an electrical potential may exist on the substrate (e.g., base material) to be coated, and changes in applied voltage, current, or current density may result in changes to the electrical potential on the substrate. In some cases, the electrodeposition process may include the use waveforms comprising one or more segments, wherein each segment involves a particular set of electrodeposition conditions (e.g., current density, current duration, electrodeposition bath temperature, etc.), as described more fully below.

Various embodiments involve electrodeposition methods wherein the grain size of electrodeposited materials (e.g., coatings, metals, alloys, and the like) may be controlled. In some embodiments, selection of a particular coating (e.g., electroplate) composition, such as the composition of an alloy deposit, may provide a coating having a desired grain size. In some embodiments, electrodeposition methods (e.g., electrodeposition conditions) described herein may be selected to produce a particular composition, thereby controlling the grain size of the deposited material.

In some embodiments, a coating (e.g., an iron alloy, a metallic layer), or portion thereof, may be electrodeposited using direct current (DC) plating. For example, a substrate (e.g., electrode) may be positioned in contact with (e.g., immersed within) an electrodeposition bath comprising one or more species to be deposited on the substrate. A constant, steady electrical current may be passed through the electrodeposition bath to produce a coating, or portion thereof, on the substrate. In some embodiments, the potential that is applied between the electrodes (e.g., potential control or voltage control) and/or the current or current density that is allowed to flow (e.g., current or current density control) may be varied. For example, pulses, oscillations, and/or other variations in voltage, potential, current, and/or current density, may be incorporated during the electrodeposition process. In some embodiments, pulses of controlled voltage may be alternated with pulses of controlled current or current density. In some embodiments, the coating may be formed (e.g., electrodeposited) using pulsed current electrodeposition, reverse pulse current electrodeposition, or combinations thereof.

In some cases, a bipolar waveform may be used, comprising at least one forward pulse and at least one reverse pulse, i.e., a "reverse pulse sequence." In some embodiments, the at least one reverse pulse immediately follows the at least one forward pulse. In some embodiments, the at least one forward pulse immediately follows the at least one reverse pulse. In some cases, the bipolar waveform includes multiple forward pulses and reverse pulses. Some embodiments may include a bipolar waveform comprising multiple forward pulses and reverse pulses, each pulse having a specific current density and duration. In some cases, the use of a reverse pulse sequence may allow for modulation of composition and/or grain size of the coating that is produced. Articles (e.g., a coated wire, a coil) described herein can be used as for wireless charging devices. As described herein, wireless charging (or inductive charging, used interchangeably herein) uses an electromagnetic field to transfer energy between two objects through electromagnetic induction. This is accomplished using a receive and transmit apparatus. The transmit apparatus is typically stationary and remains plugged into a standard wall outlet contains a transmit coil. The receiving apparatus is typically the device whose battery is to be recharged (e.g., a cell phone, a smartphone, a tablet, a laptop, a consumer electronic device) and contains a receiving coil. Energy is sent through an inductive coupling to an electrical device (i.e., from the transmit coil to the receive coil), which can then use that energy to charge batteries or run the device. Inductive charging uses an induction coil (i.e., transmit coil) to create an alternating electromagnetic field from within a charging base, and a second induction coil (receive coil) in the portable device receives power from the electromagnetic field and converts it back into electric current to charge the battery. The two induction coils in proximity combine to form an electrical transformer. Greater distances between sender and receiver coils can be achieved when the inductive charging system uses resonant inductive coupling.

The articles described herein may be suitable for a variety of applications. For example, in some embodiments, the article is a printed circuit board, a flexible circuit board, a flex film, a flexible circuit board, and/or an inductor coil comprising a coating (e.g., an iron alloy coating) as described above. Of course, other applications are possible as this disclosure is not so limited.

The following examples are intended to illustrate certain embodiments of the present invention, but do not exemplify the full scope of the invention.

Example 1

The following example describes coating traces of a portion of a flexible PCB with a ternary iron alloy comprising mixtures of iron, nickel, and cobalt.

Samples of wire were electroplated with 1 μm layers of NiFeCo alloy at several compositions as shown in the table below. 1 meter of each coated wire was compared to 1 meter of wire without the coating using a Keysight E4980A LCR meter across the frequency range of 100 kHz to 2 MHz. The inductance response was consistent across this range. Results for the 2 MHz data are tabulated below:

TABLE 1

Iron alloy composition of Samples 1-6

| Sample | Fe(wt %) | Ni(wt %) | Co(wt %) | Relative inductance @2 MHz vs Control |
|---|---|---|---|---|
| Control | — | — | — | 100% |
| 1 | 54.3 | 15.8 | 30.9 | 107% |
| 2 | 33.5 | 18.5 | 48 | 114% |
| 3 | 29 | 32 | 39 | 164% |

TABLE 1-continued

Iron alloy composition of Samples 1-6

| Sample | Fe(wt %) | Ni(wt %) | Co(wt %) | Relative inductance @2 MHz vs Control |
|---|---|---|---|---|
| 4 | 27 | 35 | 38 | 142% |
| 5 | 21 | 57 | 22 | 120% |
| 6 | 30 | 29 | 41 | 143% |

Surprisingly, the maximum relative inductance responses obtained for these samples were outside literature predicted optimum compositional ranges for alloys of iron, nickel, and cobalt.

While several embodiments of the present disclosure have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present disclosure. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present disclosure is/are used. Those skilled in the art will recognize or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present disclosure is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present disclosure.

What is claimed is:

1. An article, comprising:
   a coil; and
   a metallic coating comprising an iron alloy deposited on the coil,
   wherein a crystal structure of the iron alloy comprises hexagonal close packed unit cells,
   wherein at least a portion of a surface of the coil is free of the metallic coating.

2. The article of claim 1, wherein the iron alloy comprises greater than or equal to 20 wt % and less than or equal to 50 wt % nickel (Ni), greater than or equal to 20 wt % and less than or equal to 50 wt % cobalt (Co), and an optional additional metal, wherein a remaining balance of the iron alloy is iron (Fe).

3. The article of claim 1, wherein the metallic coating has a thickness of less than or equal to 1 micron and greater than or equal to 0.1 microns.

4. The article of claim 1, wherein a crystal structure of the iron alloy comprises body centered cubic or face centered cubic unit cells.

5. The article of claim 1, wherein greater than or equal to 25% and less than or equal to 75% of the surface of the coil is coated by the metallic coating.

6. The article of claim 1, wherein greater than or equal to 25% and less than or equal to 75% of the surface of the coil is free of the metallic coating.

7. The article of claim 1, wherein the article is a printed circuit board, a flex film, a flexible circuit board, or an inductor coil.

8. A circuit board, comprising:

a plurality of traces on the circuit board, and a metallic coating comprising an iron alloy deposited on a first trace of the plurality of traces;

wherein a crystal structure of the iron alloy comprises hexagonal close packed unit cells, wherein a portion of the first trace is free of the metallic coating.

9. The circuit board of claim 8, wherein the plurality of traces comprises copper, the metallic coating is deposited on the copper of the first trace, and wherein at least a portion of the copper of the first trace is free of the metallic coating.

10. The circuit board of claim 8, wherein each trace of the plurality of traces comprises three or more surfaces and wherein at least one surface of the first trace if free of the metallic coating.

11. The circuit board of claim 8, wherein one or more traces of the plurality of traces is shaped as a coil.

12. The circuit board of claim 8, wherein the first trace is shaped as a coil.

13. A method of fabricating a coil on a circuit board, the method comprising:

forming a first trace on the circuit board; and coating the first trace with a metallic coating comprising an iron alloy, wherein a crystal structure of the iron alloy comprises hexagonal close packed unit cells, wherein at least a portion of the first trace is free of the metallic coating.

14. The method of 13, wherein at least one surface of the first trace is free of the metallic coating.

15. The method of claim 13, further comprising forming a plurality of traces on the circuit board.

16. The method of claim 13, wherein any one of the forming steps comprises etching the circuit board.

17. The method of claim 13, wherein at least one trace is shaped as a coil.

18. The method of claim 13, wherein coating the circuit board comprises electroplating on the circuit board.

\*  \*  \*  \*  \*